(12) United States Patent
Tsironis

(10) Patent No.: US 7,646,268 B1
(45) Date of Patent: Jan. 12, 2010

(54) LOW FREQUENCY HARMONIC LOAD PULL TUNER AND METHOD

(75) Inventor: Christos Tsironis, 1603 St. Regis, Dollard-des-Ormeaux, Quebec (CA) H9B 3H7

(73) Assignee: Christos Tsironis, Kirkland, Quebec (CA)

( * ) Notice: Subject to any disclaimer, the term of this patent is extended or adjusted under 35 U.S.C. 154(b) by 236 days.

(21) Appl. No.: 11/643,855

(22) Filed: Dec. 22, 2006

(51) Int. Cl.
*H03H 7/38* (2006.01)
(52) U.S. Cl. .......................... 333/263; 333/32; 333/139
(58) Field of Classification Search ................ 333/139, 333/263, 32, 140
See application file for complete search history.

(56) References Cited

U.S. PATENT DOCUMENTS

| | | | |
|---|---|---|---|
| 3,906,409 A * | 9/1975 | Whitehouse | ................ 333/138 |
| 5,034,708 A | 7/1991 | Adamian et al. | |
| 6,297,649 B1 | 10/2001 | Tsironis | |
| 6,356,149 B1 * | 3/2002 | Stengel et al. | .............. 330/107 |
| 6,509,743 B1 | 1/2003 | Ferrero | |
| 6,674,293 B1 | 1/2004 | Tsironis | |
| 7,053,628 B1 | 5/2006 | Tsironis | |
| 7,135,941 B1 | 11/2006 | Tsironis | |
| 7,509,100 B2 * | 3/2009 | Toncich | ...................... 455/107 |

OTHER PUBLICATIONS

U.S. Appl. No. 11/151,419, filed Jun. 14, 2006, Christos Tsironis.
ATN Microwave Inc. "A Load Pull System With Harmonic Tuning" Microwave Journal. Mar. 1996 p. 128-132.
Product Note 79, "MPT, a Universal Multi Purpose Tuner", Focus Microwaves, Oct. 2004.
Search Algorithm Literature—Numerical Optimization Techniques for Engineering Design , McGraw Hill 1984.

* cited by examiner

*Primary Examiner*—Stephen E Jones

(57) ABSTRACT

An electro-mechanical harmonic load pull tuner uses three variable and adjustable shunt air capacitors and three variable and adjustable series phase shifters and creates independently controllable impedances at three harmonic frequencies in the frequency range between 30 and 250 MHz. Independent harmonic tuning is possible because the combination of adjustable shunt capacitors and series phase shifters allows generating more than $10^{19}$ impedance states at each frequency covering the entire Smith chart; appropriate impedance-search Error Function-based optimization algorithms allow fast harmonic tuning for impedance tuning and matching the output of RF transistors and amplifiers at the fundamental and harmonic frequencies. Stepper motors, drivers and control software are used to automate, calibrate and use the harmonic tuner in an automated harmonic load pull measuring setup.

11 Claims, 17 Drawing Sheets

Concept of automated harmonic load pull tuner, using three remotely adjustable line stretchers (phase shifters) and three remotely adjustable shunt air capacitors.

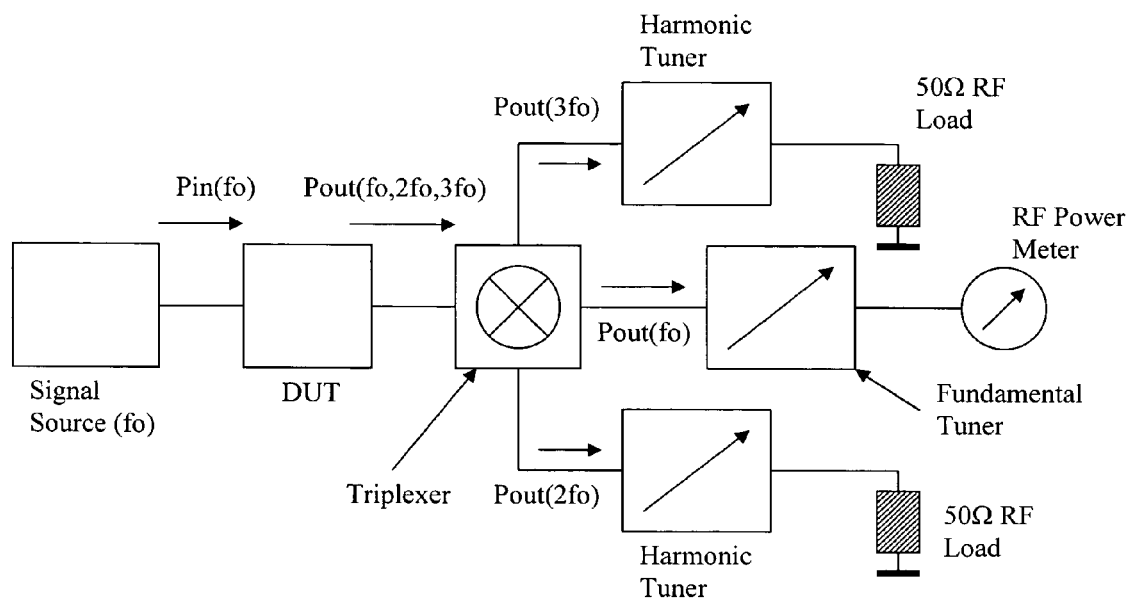
FIGURE 1: Prior Art, a harmonic load pull measurement system using wideband tuners covering the fundamental and harmonic frequency ranges and frequency discriminators (Diplexers for Fo and 2Fo or Triplexers for Fo, 2Fo and 3Fo). A wideband tuner can also be used at the source side of the DUT to extend the setup.

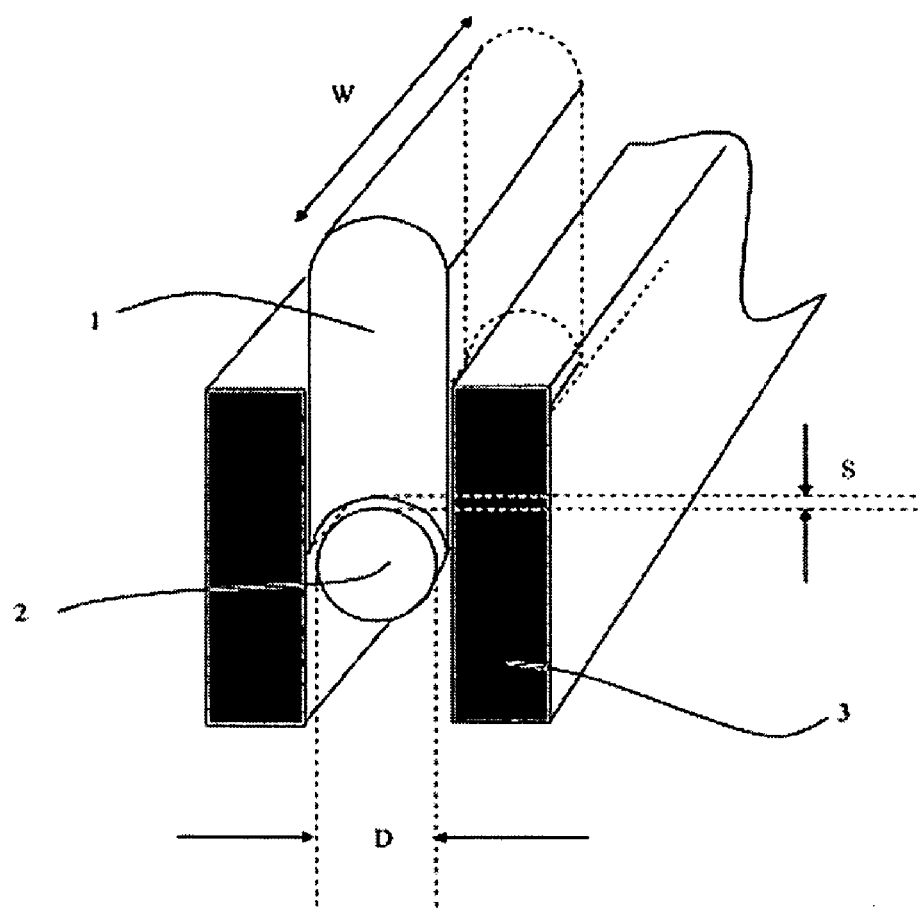
Figure 3 – Prior Art –
FIGURE 2: Prior Art, Wideband capacitive probe used in microwave slide screw impedance tuners (frequency >200MHz).

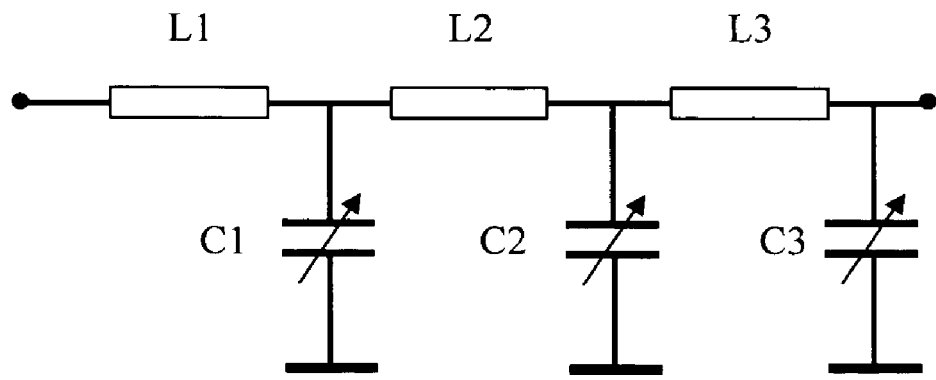
L1, L2, L3 = Fixed transmission lines
C1, C2, C3 = Variable Capacitors
FIGURE 3: Prior Art, Low frequency triple capacitor impedance tuner. L1, L2, L3 are fixed lengths, optimized for a pre-defined narrow frequency band of operation.

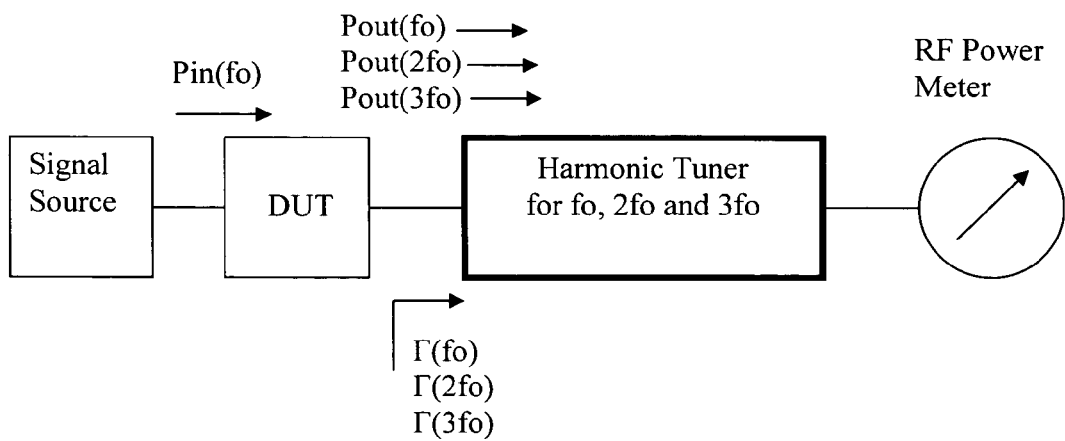
FIGURE 4: Prior Art [6, 7]: Harmonic load pull test system using a single harmonic load pull tuner. A wideband or harmonic source tuner can also be used at the source side of the DUT to extend the setup.

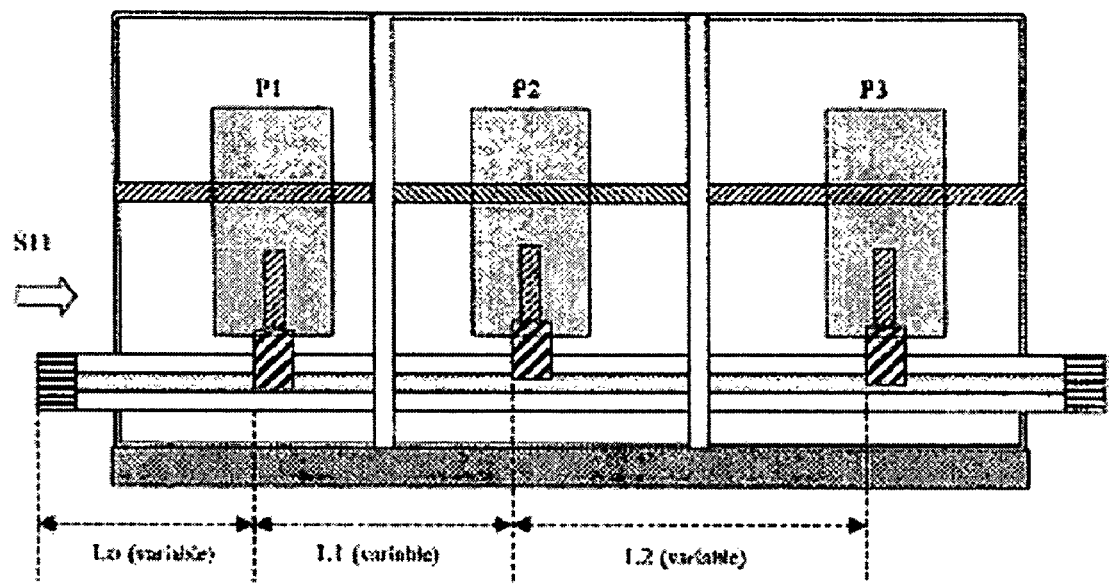
FIGURE 5: Prior Art, a three independent probe slide screw tuner, which can be used as a harmonic tuner; lowest frequency of operation reported ~800MHz.

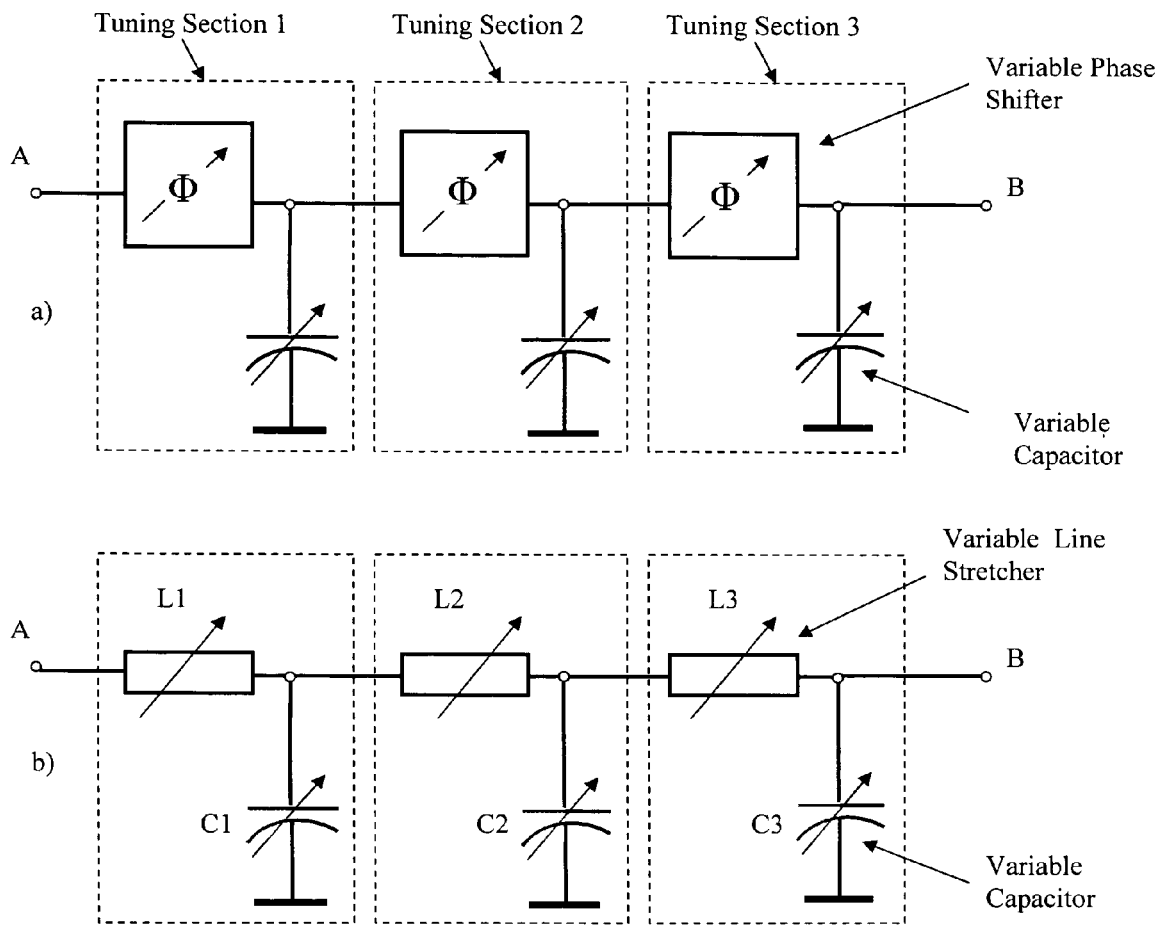
FIGURE 6a: Principle of harmonic load pull tuner using three tuning sections, each comprising an adjustable shunt air capacitor and an adjustable in-line phase shifter; 6b: Harmonic load pull tuner using adjustable transmission lines (line stretchers) as phase shifters.

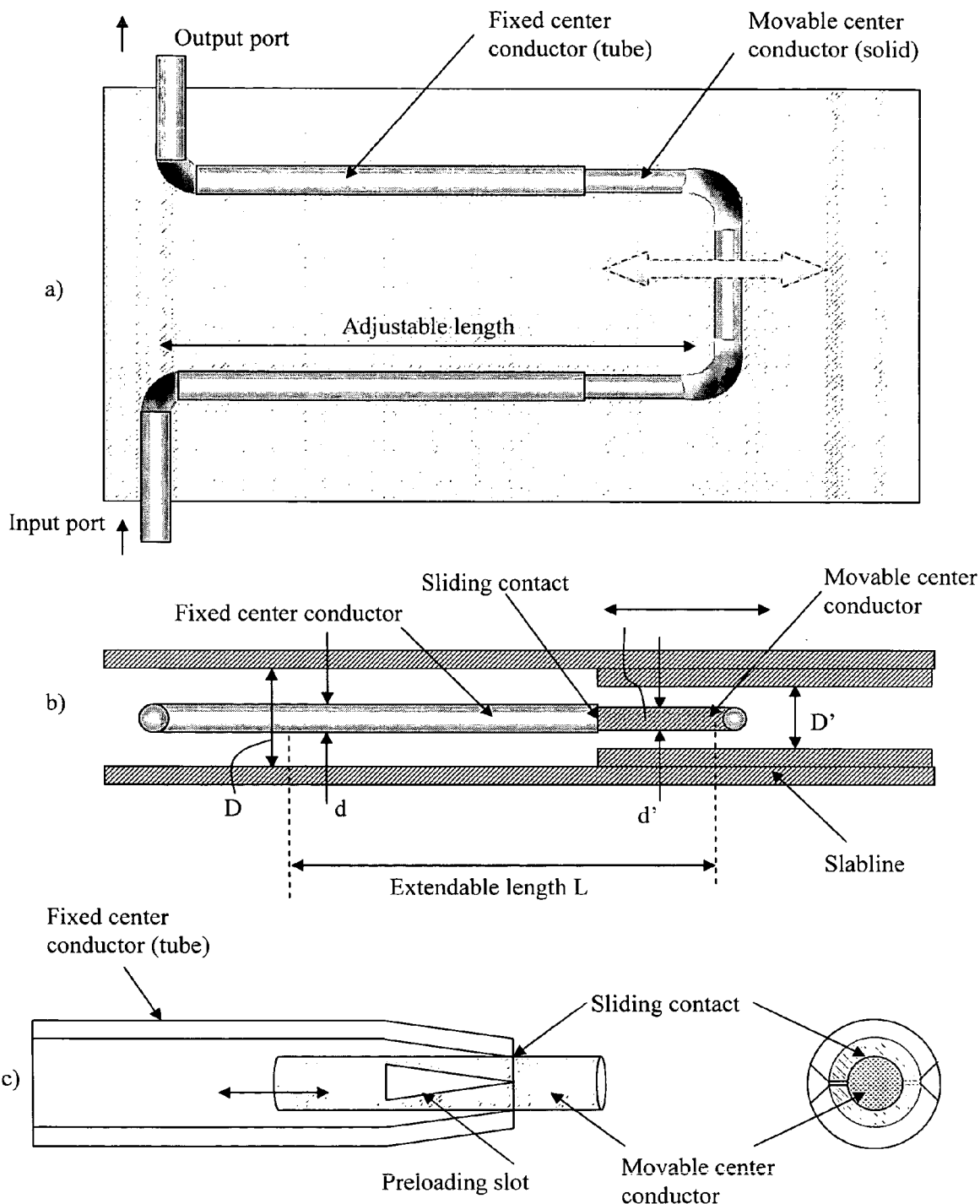

FIGURE 7: Prior Art, concept of adjustable line stretcher (in-line phase shifter) using a two-step slabline and two-piece central conductor, the ratio d/D = d'/D' determines the characteristic impedance Zo; 7a) top view, 7b) cross section showing the change in distance between slabline walls in order to maintain the ratio d/D constant, 7c) cross section of sliding contact area.

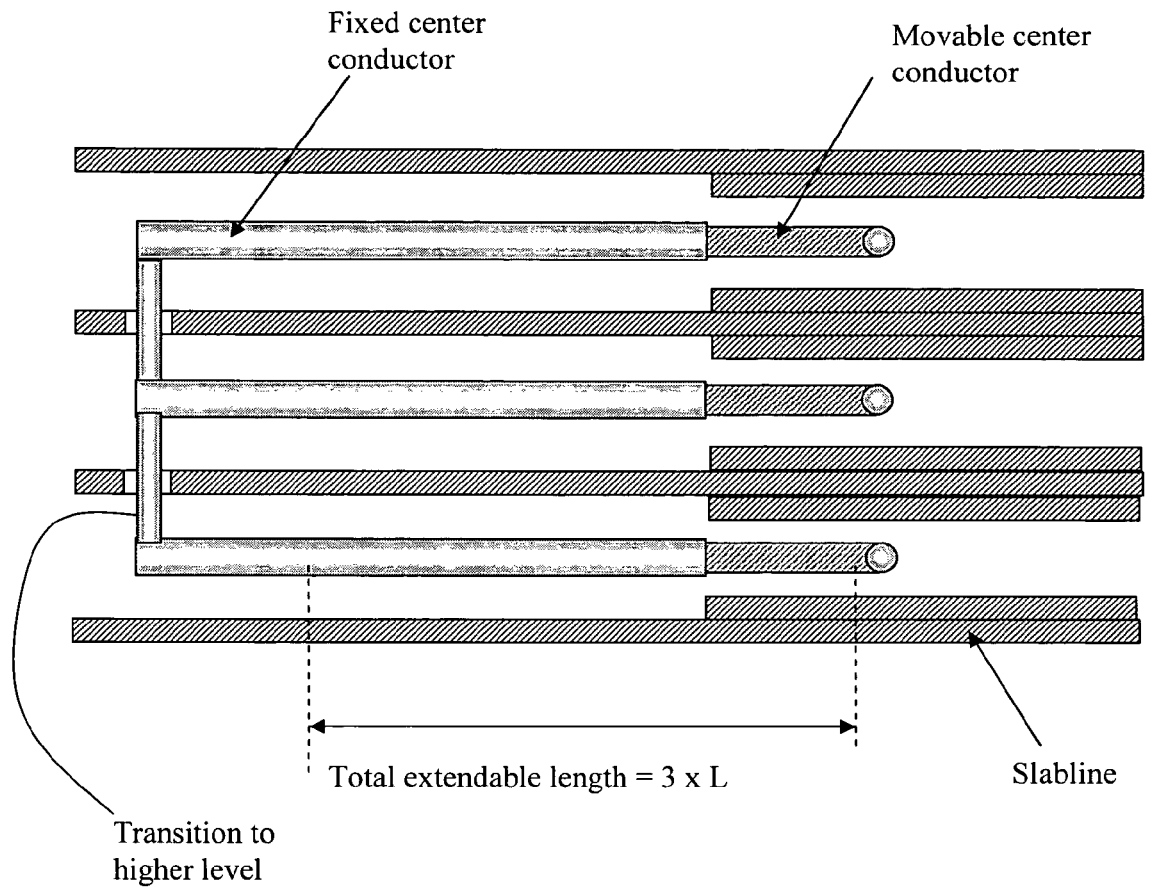
FIGURE 8: Cross section of multi-level phase shifter (line stretcher)

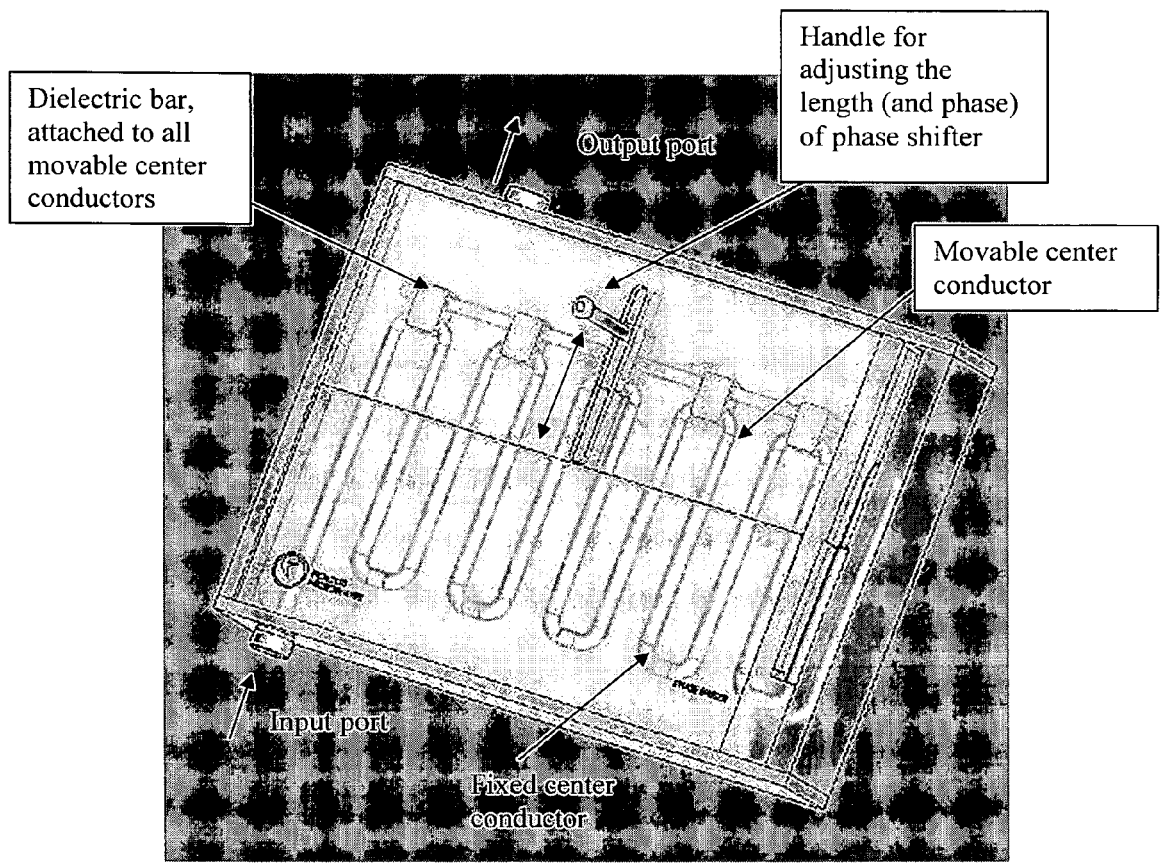
FIGURE 9: Three dimensional view of two-level multi-section phase shifter showing top level

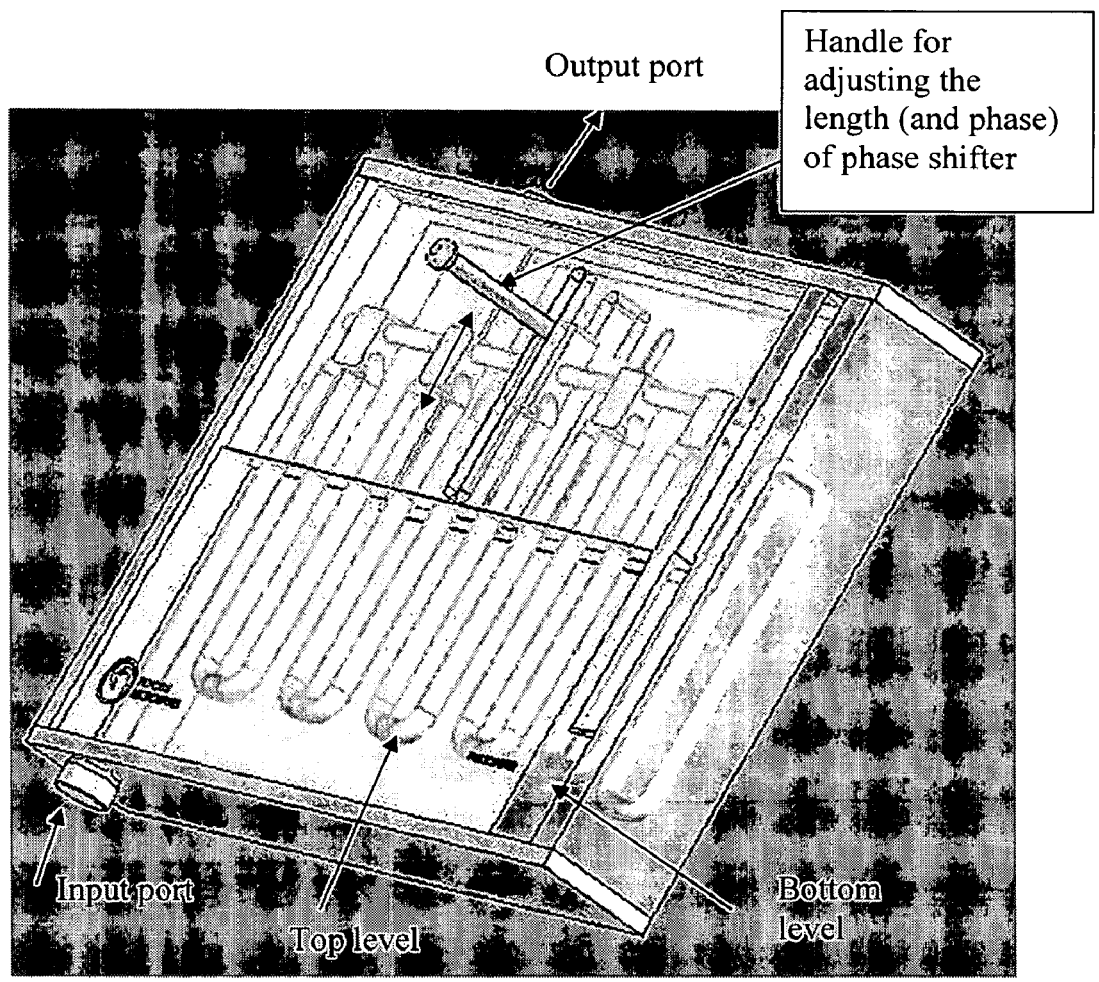
FIGURE 10: Three dimensional view of two-level multi-section phase shifter showing top and bottom level

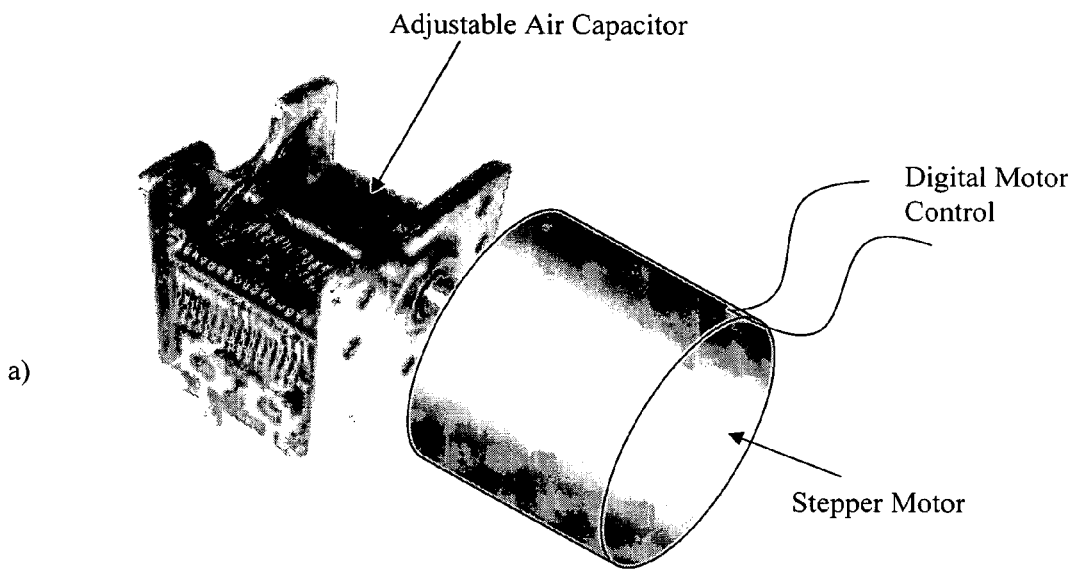
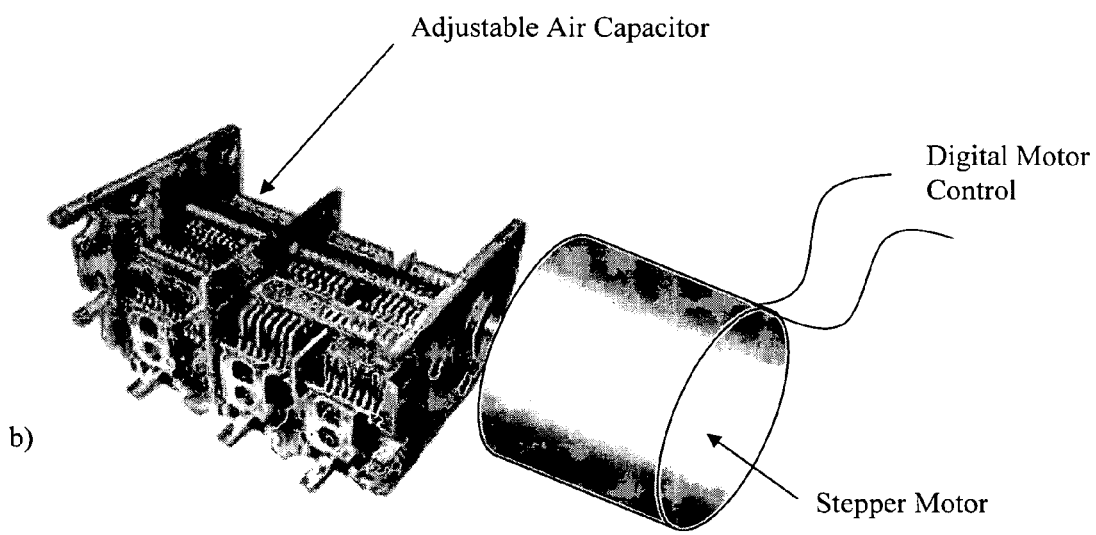
FIGURE 11: Variable air capacitors controlled by stepper motors; the single section capacitor a) is preferably used for higher frequencies F>60MHz; the triple section capacitor b) is preferably used for the lower frequencies F<60MHz

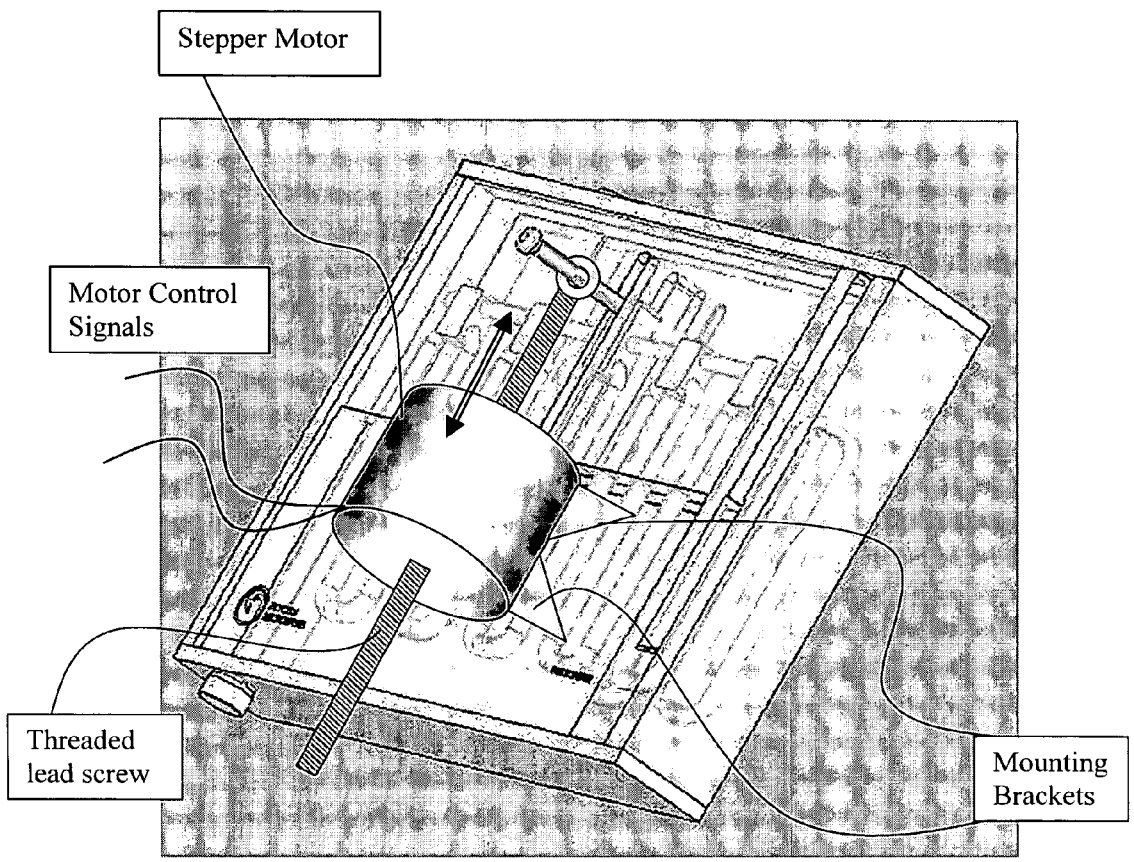
FIGURE 12: Variable phase shifter controlled by stepper motor and lead screw ("actuator": when the rotor of the motor turns the lead screw moves in and out in the direction of the arrow).

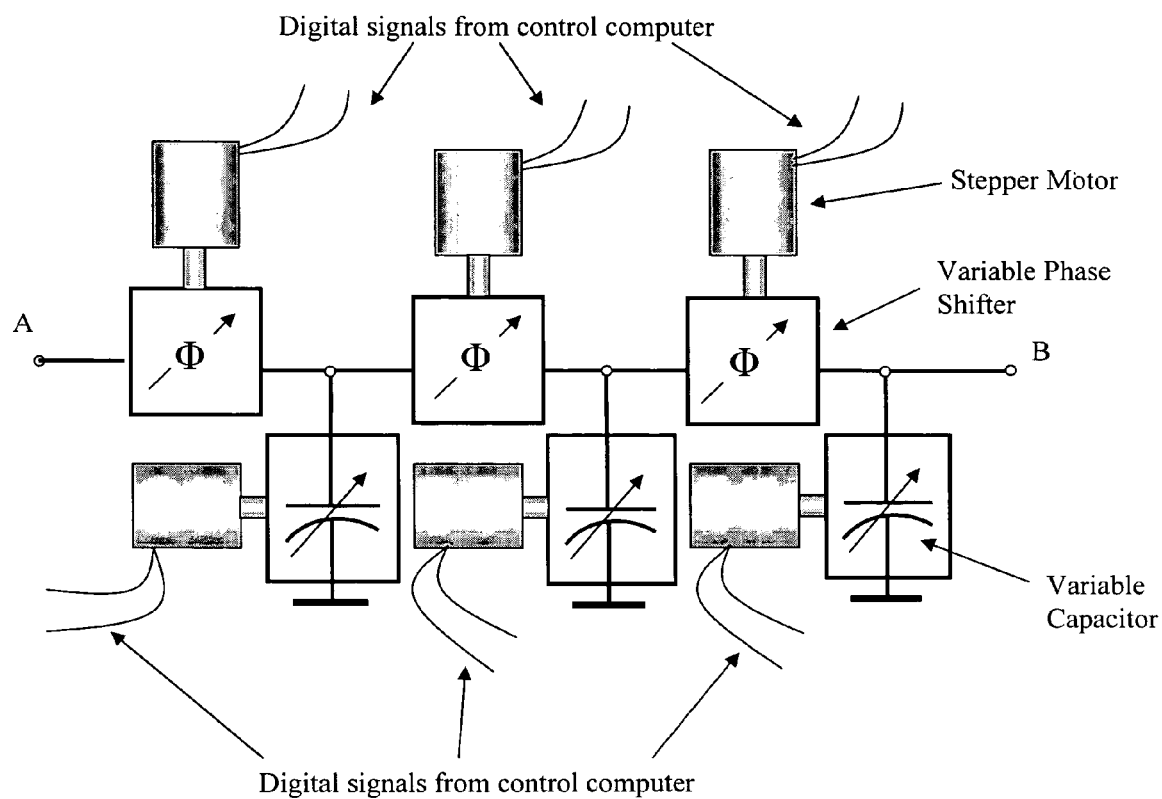
FIGURE 13: Concept of automated harmonic load pull tuner, using three remotely adjustable line stretchers (phase shifters) and three remotely adjustable shunt air capacitors.

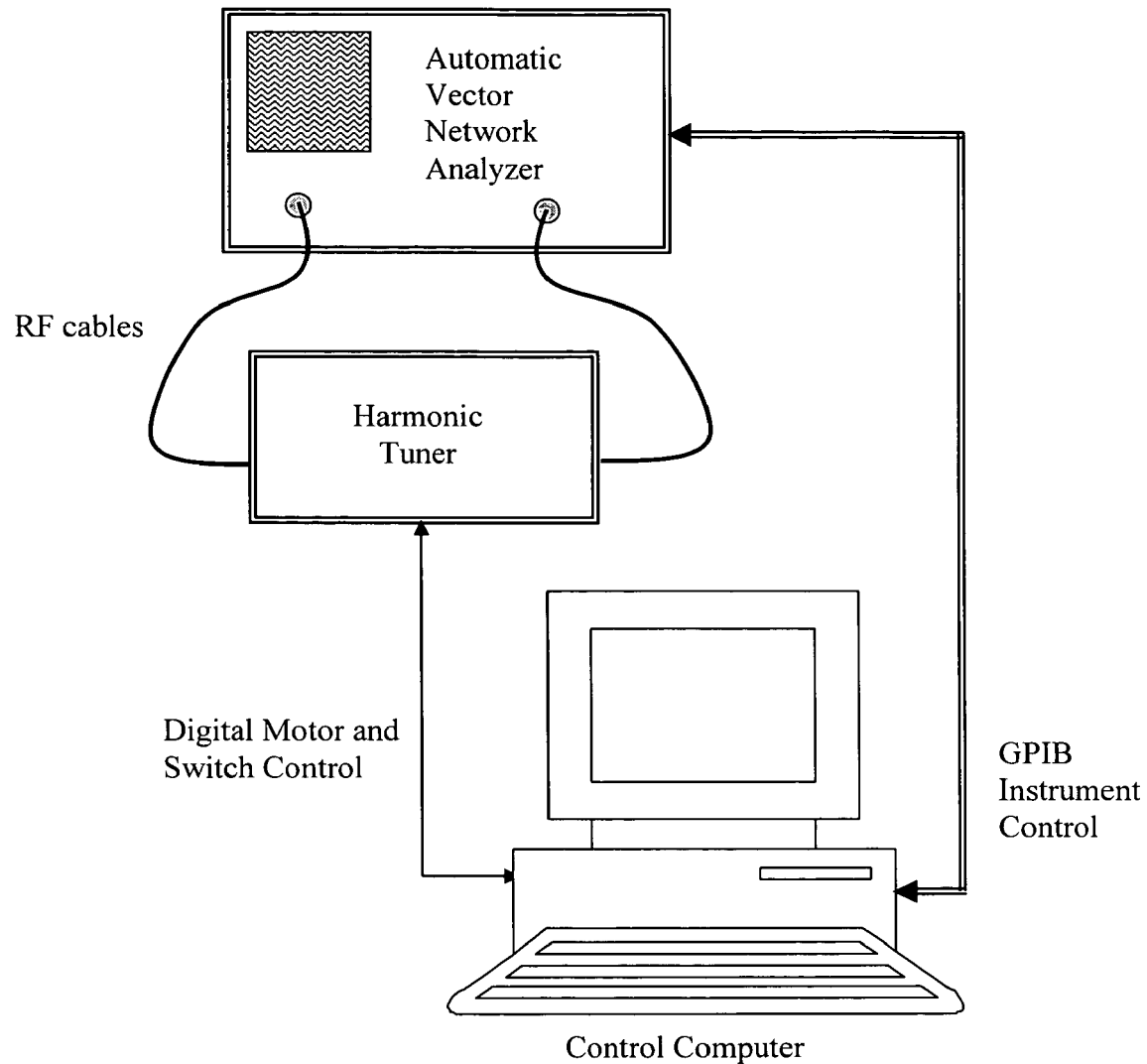
FIGURE 14: Setup for calibrating the harmonic load pull tuner using a Vector Network Analyzer and Control Computer

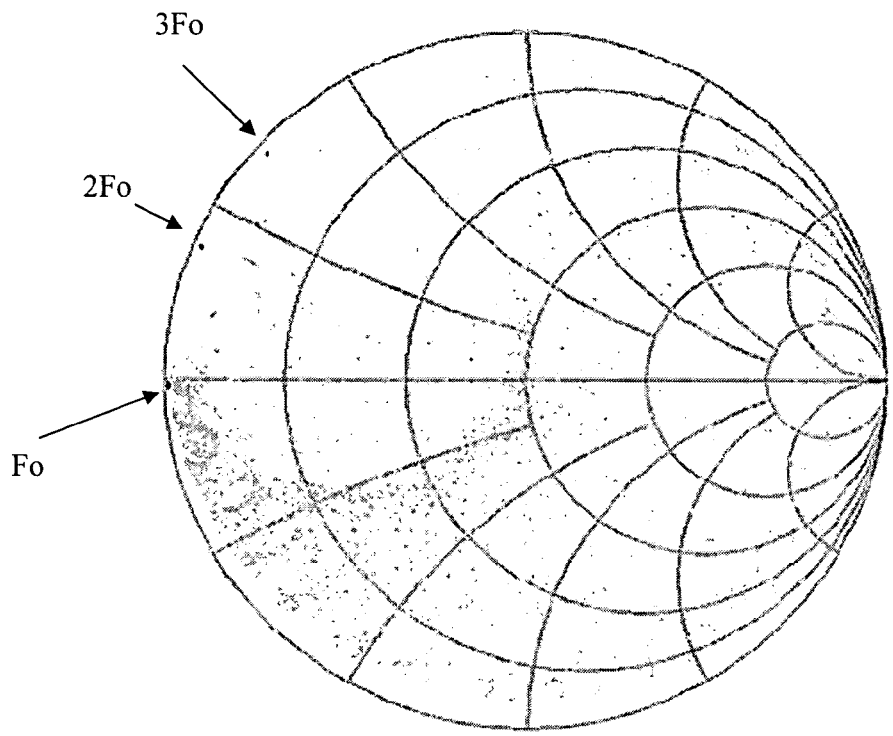

FIGURE 15: Distribution of 1000 calibration points of harmonic load pull tuner shown at one given frequency (here Fo=40MHz). The three black dots show the impedances for a given tuner state at the three harmonic frequencies: 40, 80, 120MHz. The shape of the distribution changes with the position of the interstage phase shifters. Data shown here correspond to fixed phase shifter positions and 10 variable positions of each of the three capacitors (10 x 10 x 10 =1000 states) and fixed phase shifter positions.

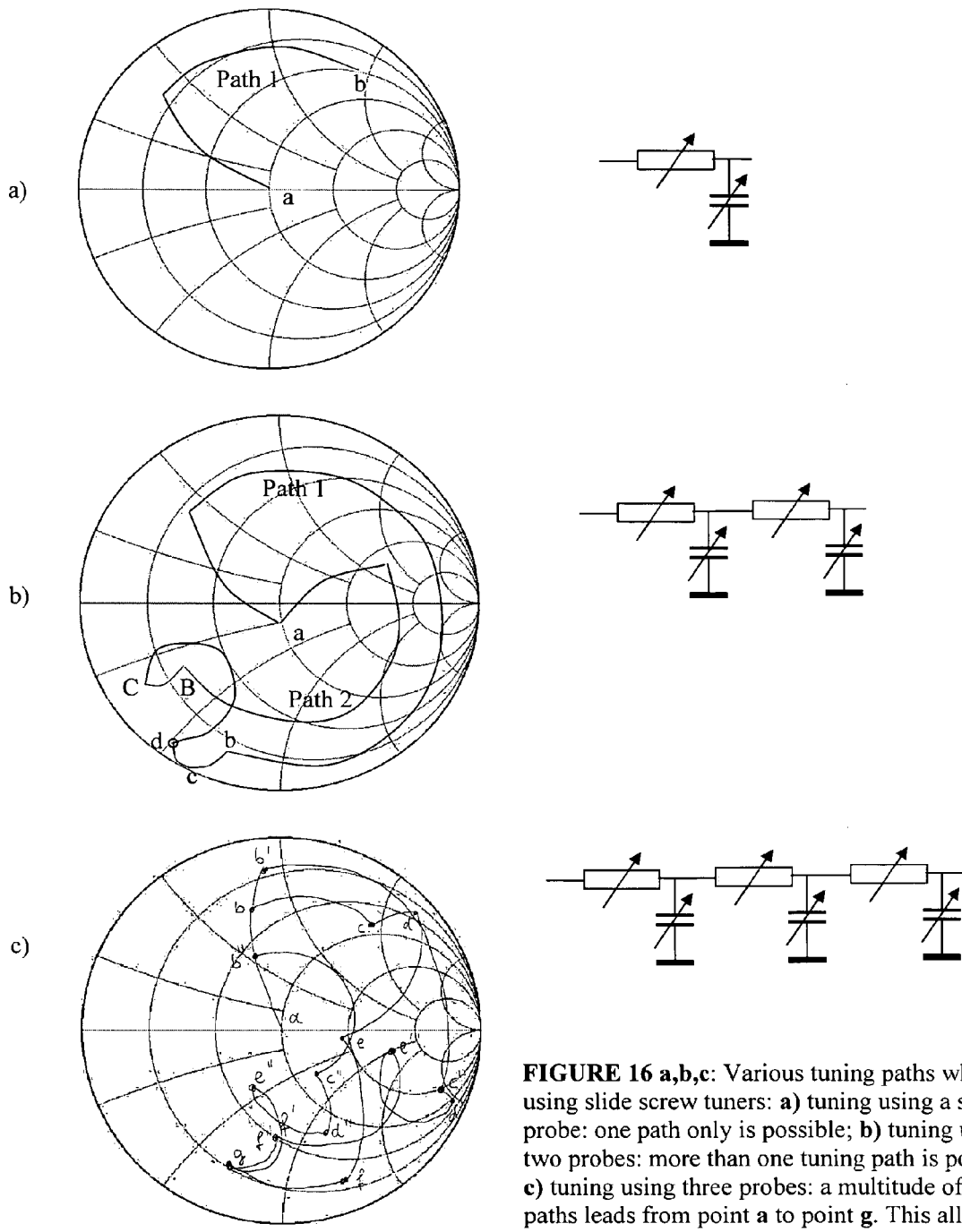
FIGURE 16 a,b,c: Various tuning paths when using slide screw tuners: a) tuning using a single probe: one path only is possible; b) tuning using two probes: more than one tuning path is possible; c) tuning using three probes: a multitude of tuning paths leads from point a to point g. This allows being able to tune simultaneously at the harmonic frequencies as well.

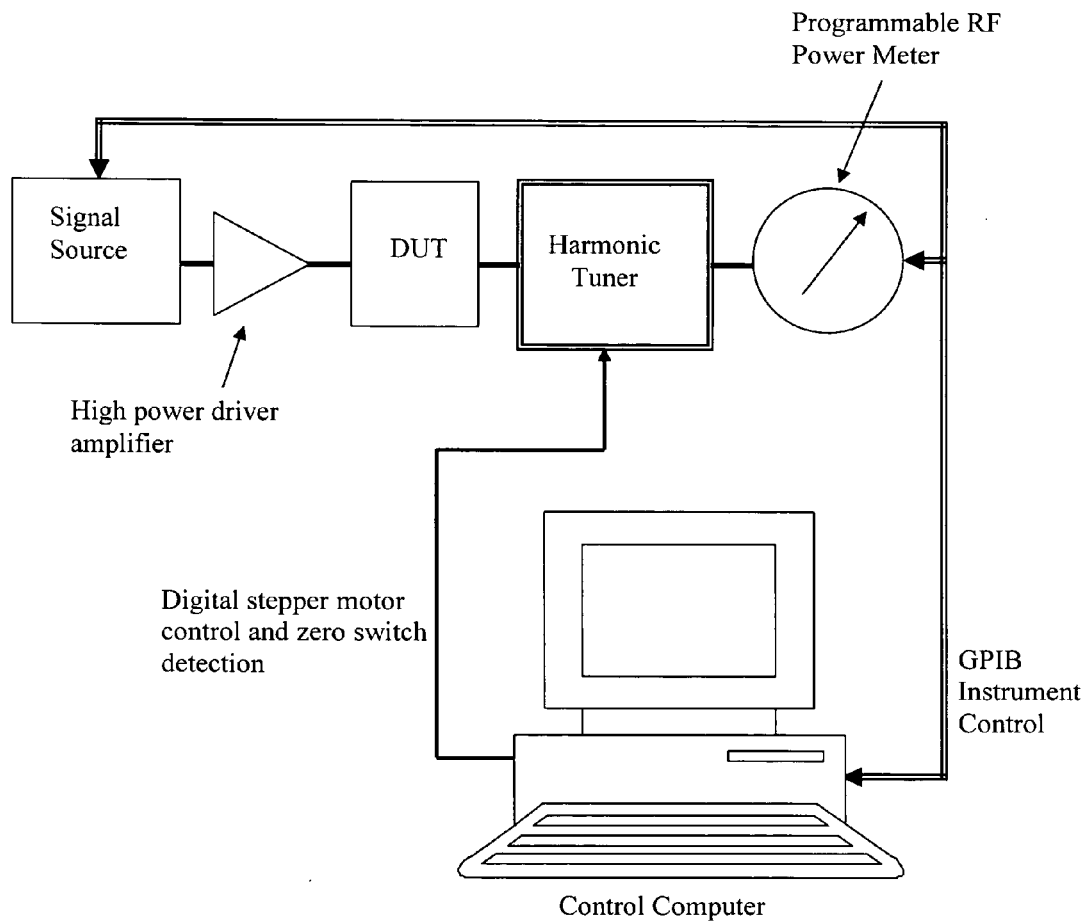
FIGURE 17: A harmonic load pull measurement setup using a low frequency harmonic load tuner. A wideband or harmonic source tuner can also be used at the source side of the DUT to extend the setup.

LOW FREQUENCY HARMONIC LOAD PULL TUNER AND METHOD

PRIORITY CLAIM

Not Applicable

CROSS-REFERENCE TO RELATED ARTICLES

[1] Tsironis U.S. Pat. No. 7,053,628, High reflection microwave tuner using metal-dielectric probe and method, FIGS. 2, 3.
[2] Adamian et al. U.S. Pat. No. 5,034,708, Programmable broadband electronic tuner.
[3] Ferrero, U.S. Pat. No. 6,509,743, Active load or source impedance synthesis apparatus for measurement test set of microwave components and systems, FIG. 3.
[4] Tsironis, U.S. Pat. No. 7,135,941, Triple probe automatic slide screw load pull tuner and method, FIG. 3.
[5] Tsironis, U.S. patent application Ser. No. 11/151,419, Low frequency electro-mechanical impedance tuner.
[6] ATN Microwave Inc., "A Load Pull System with Harmonic Tuning", Microwave Journal, March 1996.
[7] Product Note 79, MPT, a Universal Multi Purpose Tuner, Focus Microwaves, October 2004.
[8] *Numerical Optimization Techniques for Engineering Design: With Applications* by Garret N. Vanderplaats (Mcgraw Hill 1984)
[9] Tsironis, U.S. Pat. No. 6,297,649, Harmonic rejection load tuner, FIG. 6 Tsironis, U.S. Pat. No. 6,674,293, Adaptable prematched tuner system and method, FIGS. 1, 2a.

STATEMENT REGARDING FEDERALLY SPONSORED RESEARCH OR DEVELOPMENT

Not Applicable

REFERENCE TO SEQUENCE LISTING, A TABLE, OR A COMPUTER PROGRAM LISTING COMPACT DISC APPENDIX

Not Applicable

BACKGROUND OF THE INVENTION

This invention relates to load pull testing of radio frequency transistors and amplifiers under high power operating conditions, using automatic impedance tuners in order to synthesize impedances at the input and output of the test devices (DUT) at the fundamental and various harmonic frequencies.

Accurate design of high power amplifiers, oscillators and other active components used in various communication systems requires accurate knowledge of the active device's (RF transistor's) characteristics under high power operation conditions. In such circuits, it is insufficient and inaccurate to describe transistors, operating at high power in their highly non-linear regions close to saturation, using analytical or numerical models only. Instead the transistors need to be characterized using specialized test setups under the actual operating conditions.

A popular method for testing and characterizing such components (transistors) under high power operation conditions is "load pull" and "source pull". Load pull or source pull are measurement techniques employing RF impedance tuners and other RF test equipment, such as RF signal sources and RF power meters. Other components include frequency discriminators (Diplexers or Triplexers), whose task is to separate the harmonic components generated by the DUT into different paths, where they can be treated separately (FIG. 1).

The impedance tuners are used in order to manipulate the microwave impedances presented to and under which the Device under Test (DUT, amplifier or transistor) is tested (FIG. 1).

There are essentially three types of tuners used in such test setups: a) Electro-mechanical slide screw tuners [1], b) Electronic tuners [2] and c) Active tuners [3].

Electro-mechanical slide screw tuners [1] have several advantages compared to electronic and active tuners, such as long-term stability, higher handling of microwave power, easier operation and lower cost. In this type of tuner a dielectric or metallic semi-cylindrically bottomed RF probe (slug) is inserted into the slot of a slotted transmission airline as described before [4], FIG. 2; this insertion of the slug allows reflecting part of the power coming out of the DUT and creating a complex reflection factor ($\Gamma$) or complex impedance (Z) that is presented to the DUT.

The known relation between $\Gamma$ and Z is: $Z=Z_o*(1+\Gamma)/(1-\Gamma)$; where $Z_o$ is the characteristic impedance of the transmission line (slabline) in which the slug is inserted. A $Z_o$ value of 50$\Omega$ or 75$\Omega$ is typically used in this frequency range.

There are two major obstacles for making such electromechanical slide screw tuners working at radio frequencies below 100 MHz: One is the limited achievable capacitance between the RF probe and the central conductor (FIG. 2) and the other is the required length of the transmission line of the tuner.

Electromechanical slide screw tuners need to be at least one half of a wavelength ($\lambda/2$) long, in order to be able to create a phase rotation by at least 360° in order to synthesize reflection factors $\Gamma$ covering the entire Smith Chart [4]. At a frequency of 1 GHz this corresponds to a length of 15 centimeters, at 100 MHz this becomes 1.5 meters and at 10 MHz it becomes 15 meters. It is obvious that it is not possible to manufacture affordable and precise slotted airlines (slablines) bigger than 1.5 to 2 meters and use them in a RF laboratory environment. Or the minimum realistic frequency for conventional slide screw tuners is 100 MHz.

Therefore a new structure for automatic tuners has been used, the triple capacitor structure [5]. In this apparatus three mechanically adjustable air capacitors are used, which are separated by lengths of coaxial RF cable. This compact configuration allows tuning over a wide range of reflection factors, FIGS. 3, 15. This tuner uses fixed lengths of semi-rigid cable in coil form in series between shunt capacitors and has limited frequency bandwidth.

Because the three capacitor tuner [5] uses fixed lengths of transmission line between capacitor sections it allows impedance tuning over a full coverage of the Smith chart only at over a narrow frequency range. Assuming 10 settings of each capacitor, between minimum value and maximum value, the total number of states of the three cascaded tuning sections will be 10*10*10=1000. Because the length of cables between capacitors is fixed the phase of the individual reflection factors created by each capacitor cannot be rotated. This restricts the tuning range to the frequencies for which the transmission line lengths have been optimized [5].

A new tuner structure is used here which uses variable lengths of cable between the variable capacitors, in form of low frequency phase shifters; this apparatus is capable of wideband tuning and harmonic tuning.

DESCRIPTION OF PRIOR ART

A harmonic load pull system consists of adjustable tuners, able to create and adjust reflection factors at a fundamental frequency (Fo) and one or two harmonic frequencies (2Fo, 3Fo) independently. Typical tuners, based on the slide screw concept [1] are wideband, i.e. they generate reflection factors simultaneously over a frequency range of more than one octave ($F_{max}/F_{min}>2$). If these wideband tuners are connected immediately after the device under test (DUT), FIG. 1, then it is impossible to control harmonic impedances independently. To do so a frequency separation technique is required.

FIG. 1 shows a setup using a frequency diplexer or triplexer in order to create three independent frequency paths, loaded each with a wideband tuner. This concept of harmonic tuning is well known in the literature and is valid for all frequencies for which appropriate components such as tuners and diplexers/triplexers exist. Because of lack of such components harmonic load pull test systems are not known for frequencies below 800 MHz. This, on the other hand is due to the difficulty in manufacturing such components because of their required size to handle low frequencies and large wavelengths.

A simpler solution for a harmonic load pull test system will use a single multi-harmonic tuner, i.e. a tuner which allows independent tuning at harmonic frequencies without using frequency discriminators, such as diplexers and triplexers. Such a setup is shown in FIG. 4.

The alternative solution described here is a harmonic load pull setup, which uses either readily available or manufacturable and operational components in the 10 MHz to 250 MHz frequency range, which are combined in such a way as to allow for such a harmonic tuner to be assembled, calibrated and operated efficiently.

BRIEF DESCRIPTION OF THE SEVERAL VIEWS OF THE DRAWINGS

The invention and its mode of operation will be more clearly understood from the following detailed description when read with the appended drawings in which:

FIG. 1 depicts prior art, a harmonic load pull measurement system using wideband tuners covering the fundamental and harmonic frequency ranges and frequency discriminators (Diplexers for Fo and 2Fo or Triplexers for Fo, 2Fo and 3Fo). A wideband tuner can also be used at the source side of the DUT to extend the setup.

FIG. 2 depicts prior art, a wideband capacitive probe used in microwave slide screw impedance tuners (frequency>200 MHz).

FIG. 3 depicts prior art, a low frequency triple capacitor impedance tuner. L1, L2, L3 are fixed lengths, optimized for a pre-defined narrow frequency band of operation.

FIG. 4 depicts prior art [6, 7], a harmonic load pull test system using a single harmonic load pull tuner. A wideband or harmonic source tuner can also be used at the source side of the DUT to extend the setup.

FIG. 5 depicts prior art, a three independent probe slide screw tuner, which can be used as a harmonic tuner; lowest frequency of operation reported ~800 MHz.

FIG. 6a depicts the principle of harmonic load pull tuner using three tuning sections, each comprising an adjustable shunt air capacitor and an adjustable in-line phase shifter; 6b: Harmonic load pull tuner using adjustable transmission lines (line stretchers) as phase shifters.

FIG. 7 depicts prior art, the concept of adjustable line stretcher (in-line phase shifter) using a two-step slabline and two-piece central conductor, the ratio d/D=d'/D' determines the characteristic impedance Zo; 7a) top view, 7b) cross section showing the change in distance between slabline walls in order to maintain the ratio d/D constant, 7c) cross section of sliding contact area.

FIG. 8 depicts a cross section of multi-level phase shifter (line stretcher).

FIG. 9 depicts a three dimensional view of two-level multi-section phase shifter showing top level.

FIG. 10 depicts a three dimensional view of two-level multi-section phase shifter showing top and bottom level.

FIG. 11 depicts a variable air capacitors controlled by stepper motors; the single section capacitor a) is preferably used for higher frequencies F>60 MHz; the triple section capacitor b) is preferably used for the lower frequencies F<60 MHz.

FIG. 12 depicts a variable phase shifter controlled by stepper motor and lead screw ("actuator": when the rotor of the motor turns the lead screw moves in and out in the direction of the arrow).

FIG. 13 depicts the concept of automated harmonic load pull tuner, using three remotely adjustable line stretchers (phase shifters) and three remotely adjustable shunt air capacitors.

FIG. 14 depicts a setup for calibrating the harmonic load pull tuner using a Vector Network Analyzer and Control Computer.

FIG. 15 depicts the distribution of 1000 calibration points of harmonic load pull tuner shown at one given frequency (here Fo=40 MHz). The three black dots show the impedances for a given tuner state at the three harmonic frequencies: 40, 80, 120 MHz. The shape of the distribution changes with the position of the interstage phase shifters. Data shown here correspond to fixed phase shifter positions and 10 variable positions of each of the three capacitors (10*10*10=1000 states) and fixed phase shifter positions.

FIG. 16 depicts various tuning paths when using slide screw tuners: a) tuning using a single probe: one path only is possible; b) tuning using two probes: more than one tuning path is possible; c) tuning using three probes: a multitude of tuning paths leads from point a to point g. This allows being able to tune simultaneously at the harmonic frequencies as well.

FIG. 17 depicts a harmonic load pull measurement setup using a low frequency harmonic load tuner. A wideband or harmonic source tuner can also be used at the source side of the DUT to extend the setup.

DETAILED DESCRIPTION OF THE INVENTION

A new configuration for a harmonic load pull setup is described using the concept of a wideband tuner with three independent tuning sections [4]. The tuner described in [4] has a minimum frequency of operation of 800 MHz, because of the nature of its components, like capacitive wideband probes (FIG. 2) and slotted airlines (slablines). The present apparatus is designed to operate at frequencies between 30 MHz and a few hundred MHz. The main components of the present apparatus are shown in FIGS. 6a, b. They include variable shunt air capacitors and adjustable mechanical in-line phase shifters.

Beyond the hardware itself, computerized control and appropriate calibration and tuning algorithms are required to make the setup operational. Those search algorithms exist; they are described here briefly, but they are beyond the scope of this invention.

The present apparatus uses variable transmission line lengths (phase shifters) FIGS. 8, 9, 10, 11, between the capacitors FIG. 6. The adjustable length of those transmission lines is selected to vary between zero and $\lambda/2$ or 360° in reflection at the lowest frequency. Assuming a number of 100 phase settings of each transmission line (at the lowest frequency this corresponds to 3.6° per step) and 10 settings per capacitor, the total number of states that can be generated by such a tuner will be $10*100=10^3$ for each of the three stages, resulting to $(10^3)^3=10^9$ distinct tuner states for the three section combination tuner. Any other combination of settings is possible, like 50 phase settings and 20 capacitor settings, or more, etc. This extreme high density of states, combined with the sufficient coverage of the entire Smith chart (FIG. 15) by tunable points by each individual tuning section, allows for independent tuning for at least three harmonic frequencies. Not harmonic frequencies are tunable as well, as long as they fall inside the "active tuning range" of the capacitors.

"Active tuning range" is the frequency range above a frequency at which the maximum capacitance value is too low to create a low reactance $X=1/j\omega C$, where $\omega=2\pi F$, and below the series and parallel parasitic resonance of each capacitor. For a minimum frequency of 30 MHz the maximum capacitance value required is approximately 1000 pF. This can be obtained by connecting more than one capacitor stage in parallel (FIG. 7b). The phase shifters have a lowest operation frequency of 0 MHz (DC) and a higher resonance frequency than the capacitors, because they are quasi free of parasitic components, thus it will be the capacitors who will limit the frequency range.

Variable capacitors are available in many forms, either mechanical (rotary vane capacitors) or electronic form (varactors); variable mechanical capacitors can be controlled by connecting the axis of the moving section to a remotely controlled stepping motor (FIGS. 7a, 7b). Typical stepping motors turn 0.9 to 1.8° per step; this means it takes 200 to 400 steps per 360° revolution; typical mechanically adjustable rotary vane capacitors, as shown in FIGS. 7a, 7b allow for a 180° turn between minimum and maximum capacitance value. This means that, without any special arrangements each capacitor can be set to between 100 and 200 distinct positions driven by an ordinary stepping motor and associated control software. This, compared with the 10 to 20 states mentioned before, means an increase in available tuner states by a factor between 10 and 20 for each tuning section, or between $10^3=1000$ and $20^3=8000$ for the three cascaded sections. This factor is to be multiplied by the $10^9$ already tunable points.

The variable phase shifter, in a form of an adjustable line stretcher is a more challenging task. Because of the large wavelength ($\lambda(30 MHz)=10$ meters) and the need for lengths of the order of $\lambda/2$ for at least two sections (the third section may be between $\lambda/4$ and $3/8\lambda$ long) a total length of adjustable precision coaxial airline between zero and approximately 13 meters is required.

This cannot be manufactured using ordinary transmission lines for RF frequencies. It requires a multi-section multi-level approach in order to keep the size reasonable. This is described here. The basic stage of the line stretcher is shown in FIG. 8a. It consist of two L shaped conductive tubes for input and output ports and a U shaped conductive rod, which joins the two tubes. The rod can be moved in and out of the tubes, working like a trombone, thus changing the total length of the transmission line. This is the basic module for the whole multi-section stacked phase shifter.

In order to keep the characteristic impedance of the setup constant and avoid spurious reflections the transmission line is embedded inside a parallel plate (slabline) structure with two distinct areas, where the distance between the two parallel plates changes such as to maintain the ratio D/d constant, where d=diameter of conductive tube or rod and D=distance between parallel walls (FIG. 8b). The characteristic impedance of a slabline is a function of only the ratio D/d, and can therefore be kept constant over the whole length of the line stretcher, even when the movable U shaped section is pulled out.

In the structure of the line stretcher it is very important to establish continuous sliding and firm contact between the L and U shaped tubes and the U shaped rods entering those tubes. This can be done by using proper conductor material. Preferred material for the tubes is bronze or brass and for the rods solid copper or silver. Gold plating is recommended for the tubes, but not for the rods, because rubbing with the tubes at the contact area will wear the plating out.

In order to establish a continuous contact the tubes shall be sliced axially over a length of ¼ inch or so and the edges preloaded to close. This will apply a permanent, self cleaning contact with the rods entering in the tubes (FIG. 8c). The slots in the tubes shall be in the plane of the slabline's walls, where the electric field is minimum and will create the least field disturbance.

In order to generate a total length of adjustable phase the elementary module of the line stretcher (FIG. 8) must be paralleled by more such modules and stacked. This is shown in FIGS. 9, 10 and 11. In our specific case we use 5 parallel U shaped sections and a two level stacked structure. This allows for a total of 20 sections of variable length L as shown in FIG. 8b.

The adjustable line stretcher uses all its members moved together. The movable U shaped sections are attached to dielectric bars, which can slide the said U sections into the fixed U shaped tubes continuously (FIGS. 10, 11). The dielectric bars are attached to mechanical gear (FIG. 12), which is then driven by a stepper motor, which is electrically controlled by a computer running appropriate control software. The preferred mechanism used here is known as "Actuator", which uses the rotation of the rotor of a stepper motor to move the threaded axis in and out (FIG. 12). Other translation gear can, obviously, be used to move the U shaped sections in and out of the tubes. This preferred embodiment shall not limit the scope of the invention.

Using a multi-section parallel structure for the line stretcher allows for a compact packaging; the insertable part of each movable U shaped section can easily be manufactured to be between 15 and 25 cm long. In order to obtain the required length of $\lambda/2$ (at 30 MHz)=500 cm we need between 20 and 30 such sections connected in parallel. In the present embodiment of the invention we use a spiral design, which allows several U shaped sections to be included on a single layer; two layers of extendable airline then allow for the total required length of the adjustable phase shifter (FIGS. 10, 11). This means we need between 10 and 15 U shaped sections per layer. Assuming a maximum of 15 such sections and leaving a space of 1.5" between legs of the section and allowing for 0.5" for the conductor itself this will require a total of 30" of active width. Adding some 1.5" on each side for the mechanical covers and the transition from one layer to the next then the total width of the phase shifter will be 33". The length of the box will be twice the active movable length plus the U turn sections; for the 15 cm movable section this will make for a total length of 30 cm+2 U turns=40 cm or approximately 16". The height of the box will be approximately 4". The overall dimensions of the phase shifter will be: 33" W×16" L×4" H. This is an acceptable overall size of instrument and a quite compact configuration for a 30 MHz λ/2 line stretcher. Alternative combinations of lengths, widths and number of stacked layers are possible and, as far as handling allows, manufacturing concerns shall prevail.

The frequency bandwidth of the line stretcher is, in theory, as large as the bandwidth of the transmission line used starting at DC; the highest frequency of operation, the cut-off frequency, of the transmission line is determined by the appearance of secondary transmission modes and this happens approximately at a frequency at which the closest vertical distance between the surface of the center conductor and the ground walls of the slabline is λ/8 long. A typically used slabline at these frequencies has a center conductor of 7 mm diameter and a space between ground walls of 12.67 mm, so the free distance between center conductor surface and ground walls is (12.67 mm−7 mm)/2=2.84 mm; this will create secondary modes at a frequency corresponding to a wavelength λ=8×2.84 mm=22.68 mm or a cutoff frequency Fco=13.93 GHz. However parasitic elements and the quality of the adapters, connectors and, especially of the sliding contacts, may limit the practical operational bandwidth of such a line stretcher apparatus to frequencies close to or below 1 GHz, which is still fully adequate for our application in the lower MHz frequency range.

The first and the last L shaped tubes are soldered on to coaxial RF connectors. Attention must be paid to make the size and shape of the transition section between slabline field distribution and coaxial field distribution reflection-free. This is common practice and consists in keeping the ratio between the diameter of the center conductor and the ground planes constant; for Zo=50Ω characteristic impedance the approximate ratio of diameters for coaxial structures is D/d=2.33 and for slabline structures the ratio between wall distance and diameter of the center conductor is D/d=1.81 (FIG. 8b).

In order to keep the characteristic impedance Zo constant while one section of the line stretcher is moving in and out we use a two section slabline: one with a distance between walls of D=12.67 mm (for a center conductor tube of d=7 mm diameter) FIG. 8b, and a section for housing the movable U shaped section; the diameter of the center conductor of the U shaped section is d'=5 mm, which means that the wall distance of this section is D'=9.05 mm. The ratio D/d=D'/d'=1.81 remains always constant when the U shaped section moves in and out of the fixed tube and so does the overall characteristic impedance Zo=50Ω.

The harmonic tuner needs to be calibrated before using it in a load pull setup. Calibration consists in measuring the scattering parameters (s-parameters) of the tuner between its test port and idle port for different states (=motor positions) and saving them in calibration files. The data can then be retrieved and used to reproduce the impedance states to be presented to the DUT during testing. Calibration uses a Vector Network Analyzer (VNA) FIG. 14.

Since the harmonic tuner has three independent phase shifters and three independent capacitors, which can each be set at a number of states; it is obvious that we have to deal with a permutation problem. Assuming the simplest scenario of each phase shifter and variable capacitor being set to 20 different values, then the total number of states to measure amounts to $20^6$=64,000,000 states. Typical motor setting and GPIB data retrieval time from the VNA being at an average of 1 to 3 seconds, the calibration procedure would amount to 740 days for a 1 second delay and 2,222 days for a 3 second delay. In other words, the tuner cannot be calibrated and used this way.

It is possible to calibrate the tuner using the section de-embedding technique [4]. This consists in measuring the overall tuner twoport between the test port and the idle port for each tuning section, comprising one capacitor and one phase shifter, at a number of states and cascading the result with the inverse tuner matrix at the condition where all phase shifters and capacitors are at their initial state and cascading all s-parameter matrices subsequently. For 20 positions of the phase shifter and 20 positions of the variable capacitor this amounts to 20*20=400 states per tuning section. Each tuning section is then calibrated separately amounting to a total of 3*400=1200 calibration states, instead of 64,000,000, or between 20 minutes and 1 hour per calibration frequency (for an equivalent of 1 respectively 3 seconds tuner positioning and instrument reading time).

An alternative to this method is to disassemble the tuner, divide it in three individual tuning sections, each comprising one phase shifter and one capacitor, and measure the s-parameters of each section separately and save the data on the hard-disk. Then proceed as outlined below and cascade all data into a combination calibration matrix. This method may work for tuners which can easily be disassembled and the internal ports between tuning sections be made accessible; however it is a cumbersome method and the disassembling and re-assembling of RF connections usually creates inaccuracies, RF repeatability problems and measurement errors, it is therefore not the preferred calibration method.

The tuner calibration setup is shown in FIG. 14. It consists of a pre-calibrated Vector Network Analyzer (VNA), a control computer and cables for digital control and RF connections between the tuner and the VNA. The control computer sets the motor positions and reads data from the VNA using a standard GPIB communication cable and protocol. Of course other instrument communication methods, such as serial communication or TCP/IP might be used, but GPIB is today's commonly used instrument communication protocol.

Once calibrated, the data for each tuning section are saved on hard-disk of the control computer in a relatively small calibration file (including only 400 data points) and then, at operation time, the s-parameter matrices are retrieved, cascaded and saved in temporary data files on hard-disk. Subsequently interpolation routines are used to generate extremely high resolution densities of the order of $10^{19}$ states. The interpolation routines use polar coordinate format of the s-parameters included in the calibration files and employ linear phase interpolation between calibrated points with regard to phase shifter positions and linear or second order polynomial interpolation between capacitor positions.

The basic relationships used for interpolation of the test port reflection factor $S11(X,Y)=\Gamma(X,Y)*exp(\Phi(X,Y))$ in each tuning section, for any position X of any of the three phase shifters and Y for any of the three capacitors between four adjacent calibrated points (X1,Y1), (X1,Y2), (X2,Y1) and (X2,Y2) with X1<x<X2 and Y1<Y<Y2 are: $\Phi(X,Y)=\Phi(X1,Y1)-(Y-Y1)/(Y2-Y1)*\{\Phi(X1,Y1)+\Phi(X2,Y2)-\Phi(X1,Y2)-\Phi(X2,Y1)\}$ and $\Gamma(X,Y)=\Gamma(X1,Y1)+(Y-Y1)/(Y2-Y1)*\{(\Gamma(X1,Y2)-\Gamma(X1,Y1)\}$.

Such interpolation is sufficiently accurate for the application, since interpolating phase values for a linear line stretcher or a variable air capacitor are well known and follow mostly a linear or continuous polynomial relation between stepper motor positions and phase or capacitance values.

Harmonic tuning, that is the capacity of a tuner to synthesize, independently, user defined impedances at three (or more) harmonic frequencies at the same time, if there are no frequency separators (discriminators, Diplexers or Triplexers FIG. 1) in the flow of microwave energy, is based on resonances of the interfering components configured in such a manner as to occur at the right frequencies with the right phase and amplitude of the generated reflection factors. This is not simply a question of a system of six linear polynomial equations with six unknowns (three complex impedances or reflection factors contain six real numbers for amplitude and phase or real and imaginary part); it is more complex that that. It has been found by numerical search amongst the calibration data of this type of tuner that a number of not less than three independently tuning sections, such as in the present apparatus, allows synthesizing impedances at, at least, three different frequencies. However, numerical search performed in order to tune at two frequencies using a tuner with two independent stages did not "always" deliver a solution. "Always" means that in some areas of the Smith chart we obtain independent tuning and in some areas we do not. In the case of a three section tuner, as described here, exhaustive testing has shown that we always obtain solutions for tuning three independent impedances at three harmonic frequencies. It is possible that the tuner, in its present structure, may be able to tune four harmonic impedances, if frequency bandwidth is sufficient, i.e. if tuners covering a frequency range Fmax/Fmin>4 are available.

One way of describing harmonic tuning of a multi-section tuner is to visualize the change in frequency response of the reflection factor of a slide screw tuner using a single, two or three independent probes, expressed here in form of scattering parameter S11 (reflection factor at the test port) in FIGS. 16a, b and c. It can be seen from FIG. 16a, which describes a single probe tuner, that there is only a single path for tuning from the center of the Smith chart point a to the target point b at the fundamental frequency Fo. The impedances at the harmonic frequencies 2Fo and 3Fo are un-controllable. Harmonic tuning is impossible.

In the case of a two tuning section tuner (FIG. 16b) [10] there are more than one possibilities to tune from the center of the Smith chart a to the target point d at Fo (or Z(Fo)). One path, for example, follows the trail a b c d and the other a B C d. They both start and end at the same reflection factors, but following two different paths allows for synthesizing a given impedance at 2Fo on the other path. This means that, under certain circumstances, it will be possible to configure the path of S11 (frequency) to cross at a desired impedance Z(2Fo) at 2Fo, or even at impedances Z(2Fo) and Z(3Fo) simultaneously. This means harmonic tuning would be possible under certain circumstances. This depends, of course on where the first impedance Z(Fo) is located.

In the case of a three section tuner (FIG. 16c) the situation is, graphically, more confusing to represent, but, mathematically it offers the real possibility of harmonic tuning. The path followed by S11 is extremely complex to plot and can lead all over the Smith chart, depending on how the different tuning sections are set. All possible paths start at the center of the Smith chart point a and end at the same point g but come from various angles and directions. This would allow impedances at 2Fo and 3Fo to be tuned independently.

We deal here with a network of multiple resonances. The only practical way of handling the requirements of synthesizing simultaneously three (or more) impedances at three (or more) frequencies can be using an appropriate numeric search algorithm, which scans through the billions of possible tuner settings, as described before, and finds possible tuner settings for three (or more) harmonic impedance synthesis (tuning).

It has to be mentioned here that the solutions the search algorithms determine are not exact. The way the search algorithm is set, is to search for "nearby" solutions by using an ERROR function. An error function is the difference between a target impedance and an obtained value for either one, two or three harmonic frequencies. Higher harmonic frequencies can also be included.

The Error Function used for this optimization task is defined as: $EF=\Sigma\{S11_T(Fi)-S11_m(Fi)\}$, where Fi are harmonic frequencies, $S11_T$ are target reflection factors and $S11_m$ are obtained solutions of the harmonic tuning process. The sum is built over i, where i=3 is the number of harmonic frequencies considered: $F_1$=Fo, $F_2$=2Fo, $F_3$=3Fo etc. . . . . When the Error Function EF is minimum, we have a solution. As in many multi-parameter optimization problems we often get several local minima and the search algorithm has to decide whether to continue searching by changing the starting values of the search, or stop and declare a solution found. Several optimum search algorithms applicable here are known in the literature [8]. We used a gradient and a simplex optimization method alternatively.

The harmonic load pull tuner is used in a load pull setup, shown in FIG. 17. It consists of a signal source, a driver amplifier, a DUT fixture, the DUT itself, the harmonic tuner and a power meter. All instruments are remotely programmable by GPIB interface. Other communication, such as serial or TCP/IP are also possible, when available. The tuner and the instruments are all remotely controlled, set and read from a system control computer, which runs appropriate software; the software processes tuner calibration and interpolation data, calculates tuner positions and sets the motors and once the impedance conditions are set, it sets the input signal power required and reads the power meter. The measured results are saved in load pull data files, which can then be plotted using contouring software or can be processed otherwise. Additional instruments, such as a source tuner, a second signal source, a remote power supply and a spectrum analyzer can be added to the setup, for additional testing; however this is all known in the art and shall not impede on the originality of the invention.

The interpolation routines used in this preferred embodiment, as well as the calibration techniques used are deemed to be the most appropriate for the purpose of harmonic tuning; however different methods can be used for this purpose, but this shall not infer with the innovation and basic idea of the apparatus and its operation described here.

The present embodiment of this invention can easily be adapted to use other types of mechanical variable capacitors and phase shifters as well, especially those covering higher frequencies, above 250 MHz; this shall not limit the basic idea and the overall scope of the present invention, of using three line stretchers and three variable capacitors as building blocks of a harmonic load pull tuner.

What I claim as my invention is:

1. An impedance tuner, comprising an input port and an output port and a set of three or more variable line stretchers (phase shifters) connected in series between both ports and three or more variable shunt capacitors, each said variable capacitor being connected with one lead to one of the connection points between said line stretchers and with the other lead to the common ground; said line stretchers and said variable capacitors being independently adjustable; said variable capacitors being rotary capacitors and said line stretchers being made using slabline structures and U-shaped sections of central conductors, which can be telescopically extended in order to adjust the electrical length of said line stretchers.

2. A tuner, as in claim 1, in which said variable line stretchers are made using parallel plate airline (slabline) structures and cascades of U-shaped sections of central conductor, of which said central conductors' one half is movable and made from a solid conductive rod and the other half is stationary and made as a conductive tube, in which the said solid half can slide in telescopically and make perfect RF galvanic contact, both halves being placed inside the said slabline, each slabline being divided in two sections with different space between sidewalls, in order to maintain a constant center conductor diameter-to-wall space ratio and thus a constant 50Ω characteristic impedance of the transmission slabline.

3. A tuner as in claim 2, in which said variable line stretchers are made of stacked assemblies of slablines including stationary and movable sections of conductive rods, used as central conductors, which slide telescopically one inside the other making perfect RF contact, in order to allow for an extendable length of transmission slabline.

4. A tuner as in claim 3, in which the movable section of the central conductor in the slabline used in the variable line stretchers is attached to a dielectric pin, which in itself is attached to appropriate gear and a computer controlled stepper motor, which can adjust the position of said dielectric pin and movable center conductor inside the variable line stretcher using digital control signals from the controlling computer.

5. A tuner, as in claim 3, in which said variable rotary capacitors are made using conductive interdigital blades, each blade overlapping each-other in a cascading manner and changing the overall capacitance by rotating around a common axis.

6. A tuner as in claim 5, in which the axes of said rotating blades of said variable shunt capacitors are attached to appropriate mechanical gears, which said gears are attached to computer controlled stepper motors, which can adjust their angle by digital signals from the controlling computer and therefore the amount of overlapping of said blades and by consequence the capacitance of the variable capacitors.

7. A method for calibrating said tuner as in claim 6, by connecting both ports to the corresponding ports of a previously calibrated network analyzer and measuring s-parameters for a number of frequencies which are typically harmonic frequencies (2Fo, 3Fo, 4Fo) of a fundamental frequency Fo and proceeding as follows: in a first step the s-parameters of said tuner are measured for all line stretchers and capacitors set to their initial zero positions and saved in a "zero-tuner" matrix {S0}; in a second step the s-parameters of the tuner twoport are measured for a combined number of N positions of the first line stretcher and M positions of the first shunt capacitor, chosen in such a manner as to cover the entire Smith chart at the fundamental frequency Fo and saved in a first calibration file containing N*M s-parameter matrices; in a third step the s-parameters of the tuner twoport are measured for a combined number of N positions of the second line stretcher and M positions of the second shunt capacitor, chosen in such a manner as to cover the entire Smith chart at the fundamental frequency Fo, said s-parameters are cascaded with the matrix $\{S0\}^{-1}$ and saved in a second calibration file containing N*M s-parameter matrices; in a fourth step the s-parameters of the tuner twoport are measured for a combined number of N positions of the third line stretcher and M positions of the third shunt capacitor, chosen in such a manner as to cover the entire Smith chart at the fundamental frequency Fo, said s-parameters are cascaded with the matrix $\{S0\}^{-1}$ and saved in a third calibration file containing N*M s-parameter matrices.

8. A method for preparing the calibration data for optimum impedance search, consisting of retrieving the s-parameter data from the calibration files created using the procedure of claim 6 and cascading said data for all $N^3*M^3$ combinations of line stretcher and capacitor positions and saving said combined calibration data on a combination calibration file on hard-disk ready for retrieval and processing.

9. A numeric Error Function based minimum search method for searching through the combined calibration data file of claim 8 using optimum search numerical algorithms, which allow to find tuner states, which correspond to minimum Error Function, said Error Function comprising the vector difference between target RF impedances and calculated impedances of the tuner at the three harmonic frequencies, and identifying the appropriate line stretcher and capacitor positions for synthesizing simultaneously said predefined RF impedances at the harmonic frequencies and then positioning the stepper motors of each line stretcher and shunt capacitor such as to physically tune to said RF harmonic impedances.

10. A method for calibrating said tuner as of claim 6, by disassembling the three tuning sections of said tuner, each said section comprising one line stretcher and one shunt capacitor, and connecting, in a first step, each said section separately to a pre-calibrated network analyzer and measuring s-parameters of this section for at least three harmonic frequencies Fo, 2Fo and 3Fo for a combined number of N positions of the line stretchers and M positions of the shunt capacitors, chosen in such a manner as to cover the entire Smith chart at the fundamental frequency Fo, and saving the data in calibration files on hard-disk, each calibration file containing N*M s-parameter matrices; in a second step retrieving from said calibration files the s-parameter matrices of the said three tuning sections and cascading them numerically and saving them in a combination calibration file containing $N^3*M^3$ s-parameter matrices.

11. A numeric Error Function-based minimum search method for searching through the combined calibration data file of claim 10 using optimum search numerical algorithms, which allow to find tuner states, which correspond to minimum Error Function, said Error Function comprising the vector difference between target RF impedances and calculated impedances of the tuner at the three harmonic frequencies, and identifying the appropriate line stretcher and capacitor positions for synthesizing simultaneously said predefined RF impedances at the harmonic frequencies and then positioning the stepper motors of each line stretcher and shunt capacitor such as to physically tune to said RF harmonic impedances.

* * * * *